United States Patent

Kurshan et al.

Patent Number: 5,901,073
Date of Patent: May 4, 1999

[54] METHOD FOR DETECTING ERRORS IN MODELS THROUGH RESTRICTION

[75] Inventors: Robert Paul Kurshan, New York, N.Y.; Carlos Manuel Roman, Bethlehem, Pa.

[73] Assignee: Lucent Technologies Inc., Murray Hill, N.J.

[21] Appl. No.: 08/871,022

[22] Filed: Jun. 6, 1997

[51] Int. Cl.⁶ .................................................. G06F 9/45
[52] U.S. Cl. .................. 364/578; 395/500; 395/183.13; 395/183.14; 395/709
[58] Field of Search .................................. 395/500, 826, 395/710, 709, 183.01, 183.13, 183.14, 704, 10; 364/578; 706/11, 52

[56] References Cited

U.S. PATENT DOCUMENTS

| | | | |
|---|---|---|---|
| 5,163,016 | 11/1992 | Har'El et al. | 364/578 |
| 5,485,409 | 1/1996 | Gupta et al. | 395/186 |
| 5,522,014 | 5/1996 | Clark et al. | 395/10 |
| 5,604,841 | 2/1997 | Hamilton et al. | 395/12 |
| 5,691,925 | 11/1997 | Hardin et al. | 364/578 |

OTHER PUBLICATIONS

Bachmair et al., "Rewrite Techniques for Transitive Relations", IEEE, 1994, pp. 384–393.

*Primary Examiner*—Kevin J. Teska
*Assistant Examiner*—Thai Phan
*Attorney, Agent, or Firm*—James A. DiGiorgio; Stephen M. Gurey

[57] ABSTRACT

The invention presents a method and apparatus for forming a restricted model from a system model to reduce the computational resources required to formally verify the system design, without substantially reducing the ability to test all system model functions, or properties. In general, the restricted model is formed by restricting the range of assumable values of system model variables and system model inputs to a restricted set of values, based on the values assumed by the system model variables and system model inputs during a partial search of the system model. The restricted model can then be fully searched by a conventional verification tool to identify system design errors. Advantageously, the restricted model requires less computational resources during a fall search than the original system model.

34 Claims, 2 Drawing Sheets

METHOD FOR DETECTING ERRORS IN MODELS THROUGH RESTRICTION

FIELD OF THE INVENTION

The present invention relates to system verification, and more particularly to a method for checking the behavior of system models.

BACKGROUND OF THE INVENTION

An ongoing problem in the design of large systems is verifying that the system will behave in the manner as intended by its designers. One approach has been to simply try out the system, either by building and testing the system itself or by building and testing a model of the system. Since there is no guarantee that an untested system will work as expected, building the system itself can be an expensive proposition. Thus, those skilled in the art have migrated toward building and testing a model of the system through software.

A system model can be said to be a computer program or block of code that, when executed, simulates the intended properties (i.e. functions and/or features) of the system. The computer program, or system model, is designed to accept inputs, perform functions and generate outputs in the same manner as would the actual system. Thus, by controlling the value of the system model inputs and monitoring the system model outputs, the functionality, or properties, of the system can be tested.

One method of testing a system model is called formal verification. In formal verification, the computer program (i.e. system model) is fed into a verification tool which converts the system model into a finite state machine. The finite state machine is a set of states and state transitions which mimic the operation of the system model in response to any given set of system model inputs. More specifically, each state represents a state the system model would enter given a set of inputs, and each state transition indicates the conditions (i.e. the value of system model inputs and system model variables) that must be met for the system model to transition from one state to another state.

A system model state machine can be used by the verification tool to test whether the system model behaves according to a set of expected behaviors (i.e. system properties). To do this, the verification tool controls and/or varies the system model inputs and monitors which states the system model enters as a result of the inputs. From this information, the verification tool can check whether the system model entered a state or a cycle of states which the designers of the system define as "bad" or unintended. If the system model enters a "bad" state or a "bad" cycle of states (i.e. repeatedly entering the same states over and over again), the system model is said to behave in a manner contradictory to that intended by the system designer.

Heretofore, in order to fully test every property or function of the system model through formal verification, the verification tool runs what is called a fall search of the system model state space (i.e. the set of states and transitions that comprise the system model state machine). A full search of a system model state space is a test wherein the system model inputs are varied such that each system model input takes on every value it can possibly assume during operation of the system model. That is, a fall search tests the behavior of the system model in response to every possible set of input values that the system model inputs can possibly assume when the system model is in operation. As a result, a full search insures that the system model behavior is tested under every set of conditions (i.e. every set of input values) that the system model can possibly undergo when in operation. Thus, a full search of a system model state space insures that every function, or property, of the system model is fully tested.

For example, a full search can be performed on a system model of a counter which increments a number, by one, up to ten each time it receives an input having a value of binary zero, and decrements the number, by one, down to zero each time it receives an input having a value of binary one. In such a system model, the numbers 0 through 10 represent the states the system model can enter, and the input values, binary zero and binary one, control the transitions between the states. When fully searching the system model, the search engine can start at a state representing the number 1 (i.e. state 1), vary As the input over the entire range of assumable values (i.e. binary one and binary zero) and identify the set of "next states" that the system model can possibly enter (e.g. state 0 when the input has a value of binary one, or state 2 when the input has a value of binary zero). Then, for each of the identified possible "next states," the inputs are again varied over the entire range of possible values to determine a new set of next states. This process is repeated until the search engine traces through the system model state space and determines that the system model can only enter a state (i.e. next state) that was already entered, or checked. Ultimately, if the full search finds that the system model did not enter an undesirable or "bad" state or set of states in response to a set of inputs, then the system model design is said to be error-free. That is, the system model is said to behave according to a design specification.

From this example, it is evident that running a full search to verify the behavior of a system model having one input with an assumable range of only two values (i.e. binary zero and binary one) can be an involved process, requiring a great deal of computational work. As a result, one can imagine that the more complex the system model becomes (i.e. the greater the number of system model inputs and/or the wider the range of assumable values for each input), the greater the chance that a computer-aided verification system will be incapable of handling the amount and/or complexity of the computations necessary to complete a full search. In fact, it has been found that verifying, or fully searching, such complex models with conventional verification tools can cause the verification tool to run out of computational resources (e.g. no more RAM available to the testing engine). When this happens, the verification tool may "lock-up" (i.e. stop the full search) without providing the tester with data as to whether the system model had behaved as expected for any part of the full search performed before the "lock-up." As a result, when fully searching such complex system models with conventional verification tools, the tester may be left with no way of determining whether the system model has a design error (i.e. can enter a "bad" state).

One solution to this problem is to reduce the size of the system model and run a full search of the reduced model. That is, a tester or programmer experienced in the details of the system model (i.e. how the system inputs and system variables affect the behavior of the system model) may eliminate portions of the system model (i.e. lines of code and/or system model inputs and variables) that appear to have no effect on a limited set of system properties (i.e. those system functions which the programmer decides are not critical to check). This may require, however, substantial time, effort and experience on the part of the programmer to insure that the system model is not reduced such that the reduced model fails to retain those portions that are critical for testing the designated set of system properties. In addition, although reducing the system model reduces the amount of computational resources required to check the system model, such a reduction prevents a full search from checking the behavior of all system model properties, or functions.

SUMMARY OF THE INVENTION

We have discovered a method and apparatus for reducing the computer resources needed for checking the behavior of a system model, substantially eliminating any requirement that the user have knowledge of the system model design, and maintaining the ability to test substantially all system model properties. This is accomplished by restricting the range of assumable values of a set of system model variables and system model inputs, based on the behavior of the system model during a partial search. A partial search is a search which identifies the states which the system model can enter when given a partial set of input values. That is, a partial search does not test the behavior of the system model in response to every possible input value (i.e. the entire range of assumable values) as described for the full search above. Rather, during a partial search, the system model inputs assume only a portion of the total range of assumable values, but not every value in that assumable range of values. In general the values assumed by each system model variable or system model input during the partial search are used to define a restricted set of assumable values for that variable or input, wherein each restricted set of assumable values defines the values that the particular system model input or variable can assume during system model verification. By defining a restricted set of assumable values for a set of system model variables and system model inputs, the system model is thereby transformed into a restricted model. Once formed, the restricted model can be fully searched by a conventional verification tool to identify design errors in the system model. Advantageously, the restricted model requires less computational resources than the original system model during a full-search.

In one illustrative embodiment, the partial search is a random partial search. A random partial search is a partial search wherein the limited number of values input to the system model inputs are randomly chosen, rather than predetermined by a tester, and as with a full search, the random partial search continues until no new states are found. A random partial search eliminates the guesswork of the tester and empowers the search engine to randomly choose the values input to the system model. In such an embodiment, the restricted set of assumable values for each system model variable and each system model input may be limited to those values that the input or variable assumed during the random partial search of the system model.

In a preferred embodiment, before the partial search, the system model is first reduced to eliminate the system model variables and system model inputs, as well as the assumable values of the variables and inputs, that have no effect on the behavior of the set of system properties, or functions, being tested. The resultant reduced system model is then restricted, as described above, to form a restricted/reduced model. The restricted set of assumable values of each variable and input of the restricted/reduced model is limited to those values that the particular input or variable assumed during the partial search. Thus restricted, certain variable dependencies are broken, and the model may be further reduced as in the reduction step preceding the partial search. The resultant restricted/reduced model can then be run through a fall search to check the behavior of the set of system properties, and thus identify design errors without exhausting the computational resources of the verification tool.

In any embodiment of the present invention, if an error is identified during the partial search of the system model or a derivative of a system model (e.g. a reduced model), there is full assurance that the error exists in the original system model. If, however, no error is found in the partial search, there is only partial assurance that the system model is error-free. The partial assurance is due to the fact that only a partial search was performed on the original system model, and thus the behavior of the system model was tested in response to a limited set of inputs.

If, however, an error is identified during a full search of a restricted model or a derivative of a restricted model (e.g. a restricted/reduced model) formed according to the present invention, then there is only partial assurance that the error is a true error. This is due to the fact that the step of restricting the model, as described herein, may result in some system model variables being restricted to a constant value, whereas other system model variables may be restricted to a plurality of values (i.e. a non-constant variable). When this happens, there often arises the situation wherein a variable which has been set to a constant value is dependent on the value of a non-constant variable. This essentially has the effect of breaking the dependency between the now-constant variable and any variable upon which the value of the now-constant variable depended in the system model. This is due to the fact that the now-constant variable no longer will change value depending on the value of the variable upon which it previously depended.

When a restricted model having such broken dependencies is fully searched, there may be a set of inputs which cause the constant system model variable to remain at a value which it would not have assumed if the same set of inputs were input to the original (i.e. non-restricted) system model. As a result, the restricted system model may mistakenly enter a state or set of states that the original system model would not have entered given the same set of inputs. Moreover, due to the restricted model entering the mistaken state or set of states, a full search of the restricted model may report an error that does not exist in the original model. Such and error is said to be a "false" error because it is not due to an error in the original model, rather it is a result of an imperfect restriction of the original model.

Thus, in order to obtain full assurance that an error identified during a full search of a restricted system model according to the present invention is a true error, additional steps must be taken. In one embodiment, the additional steps may include the step of verifying that the identified error exists in the original system model. In another embodiment, the additional steps may include the step of adjusting the restricted model, before the full search, to guarantee that the restricted model will behave as would the original system model, when given a set of inputs.

Thus, although a fall search of a restricted model, according to the present invention, can not fully insure that the original model is error-free in all cases, the restricted model enables the identification of errors in complex models which previously could not be reliably tested through conventional verification tools. As a result, the present invention overcomes, to a significant extent, the limitations associated with the prior art.

These and other features of the invention will become more apparent from the detailed description of illustrative embodiments of the invention when taken with the drawings. The scope of the invention, however, is limited only by the claims.

BRIEF DESCRIPTION OF THE DRAWINGS

FIG. 3 is a block diagram of an illustrative embodiment of a method according to the present invention;

DETAILED DESCRIPTION OF ILLUSTRATIVE EMBODIMENTS OF THE INVENTION

As described above, a model of a system (i.e. system model) is basically a computer program that is designed to accept inputs, perform functions and generate outputs in the same manner as would the actual system. A system model can be defined as a system of states and state transitions (i.e. a finite state machine) which mimics the manner in which the system would respond to a given set of inputs. The finite state machine can be said to define a state space which includes the system of states and state transitions.

In general, a finite state machine of a system model defines the possible states the system model can enter, and the conditions upon which the system model will transition from one state to another state, i.e. state transition, wherein the conditions for the state transitions depend on the value of system model inputs and system model variables. More specifically, when the system model inputs and system model variables assume values that cause a given state transition, the system model will transition between the states defined by the given state transition.

Figure 1:
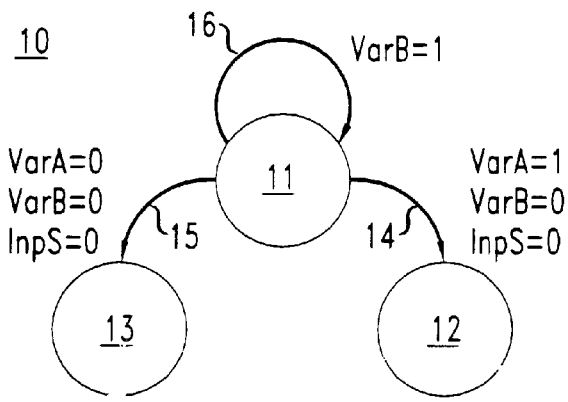
FIG. 1 is a state diagram of a system model.

An illustration of a system model state machine, hereinafter referred to as state machine 10, is shown in FIG. 1. As shown, state machine 10 has a set of states 11–13, and a set of state transitions 14–16. State transition 14 defines the condition (i.e. Variable A=1, Variable B=0 and Input S=0) upon which the system model transitions from state 11 to state 12. State transition 15 defines the condition (i.e. Variable A=0, Variable B=0 and Input S=0) upon which the system model will transition form state 11 to state 13. State transition 16 defines the condition (i.e. Variable B=1) upon which the system model remains at state 11. It should be noted that Variables A and B are variables used by the system model to define the behavior of the system model, and Input S is an input to the system model. Input S and Variables A and B each have an associated "range of assumable values" which defines the range of values that each can possibly assume when the system model is in operation.

As described above, a verification tool can be used to test the behavior of a system model by performing a search of the state space defined by the system-model finite-state machine. To fully test every function, or property, of the system model, the verification tool can perform a full search of the system model state space. A full search of the system model state space involves testing the behavior of the system model in response to every possible set of values that each input can assume during operation of the system. As a result, a full search insures that the behavior of the system model is checked in response to every possible combination of input values that the system model inputs can possibly assume. This has been referred to as testing the system model inputs over their entire range of assumable values.

For example, a full search of state machine 10 would involve testing the behavior of state machine 10 in response to every possible value that Input S could possibly assume. In a more complex system model (i.e. a model having a plurality of inputs and/or a wide range of assumable variables for each input), however, such a fall search can require more computational resources than are available to the verification tool performing the full search. Thus, it may be impossible to perform a full search of some complex system models with a conventional verification tool.

One method for reducing the amount of computational resources needed to test the behavior of a system model is to program the verification tool to perform a partial search. A partial search is similar to a full search except that the behavior of the system model is tested in response to only a portion of the total range of assumable values that each input can assume. Thus, a partial search of state machine 10 would involve testing the behavior of state machine 10 in response to only a portion of the inputs that it can possibly assume when in operation. That is, a partial search of state machine 10 would involve testing the behavior of state machine 10 in response to only a portion of the values which input S could possibly assume.

Figure 2:
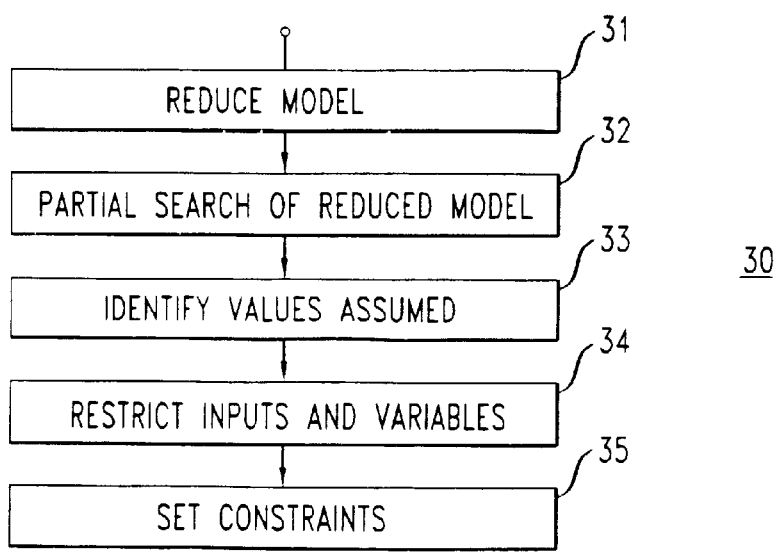
FIG. 2 is a table that illustrates the behavior of a system model, represented by the state diagram shown in FIG. 1, during a partial search.

Referring now to FIG. 2 there is shown a table 20 illustrating the behavior of state machine 10 during a partial search. As shown, table 20 has three columns 21, 22, and 23. Column 21 shows that the range of assumable values for Input S is 0 through 5, the range of assumable values for Variable A is 0 through 4, and the range of assumable values for Variable B is 0 through 3. Column 22 shows that during the partial search of state machine 10, Input S was given the set of values 0, 1, and 3, which is only a portion of the total number of values Input S could assume, as shown in column 21. Column 23 shows the actual values assumed by Input S, and Variables A and B during the partial search.

Notice that even though the range of assumable values of Input S is 0 through 5 as shown in column 21, such a partial search would only test the behavior of state machine 10 in response to a portion of the possible input values (i.e. 0, 1 and 3). As a result, there is a chance that the set of input values used during the partial search would fail to expose a system model error that would have been exposed if the entire range of assumable variables were input to Input S. Thus, although performing a partial search may reduce the amount of computational resources needed to test the system model, the tester is left with the difficult task of guessing which set of inputs should be included in the search, and is left with no assurance that all system model properties, or functions, would be tested.

We have discovered that the behavior of a system model, during a partial search, can be utilized to reduce the computational resources required to fully search the system model, without decreasing the ability to substantially test all system model properties, or functions. In general, this is done by restricting the range of assumable values of a set of system model inputs and system model variables, based on the values assumed by the system model inputs and the system model variables during a partial search of the system model, to thereby form a restricted model. The restricted model can then be fully searched by a conventional verification tool to identify system errors, but with substantially less risk of exhausting the computational resources available to the verification tool than when fully searching the system model.

By considering the table shown in FIG. 2 in greater detail, it can be appreciated how the system model represented by state machine 10 can be restricted to form a restricted model according to the present invention. As shown FIG. 2 illustrates the behavior of state machine 10 when partially searched by a conventional verification tool. Column 21 lists the range of assumable values for Input S and Variables A and B, column 22 shows the set of values input to Input S during the partial search, and column 23 shows the values that Variables A and B assumed when Input S was given the values shown in column 2.

From this partial search data, the system model represented by state machine 10 can be restricted to form a restricted model. This is done by limited the range of assumable values for Input S and Variables A and B to restricted set of values, based on the actual values assumed during the partial search (i.e. the values shown in column 23). For example, according to the present invention, Input S can be restricted to the values 0, 1, and 3, Variable A can be restricted to the values 0, 1 and 3, and Variable B can be restricted to the values 0, 1 and 2. Thus, according to the present invention, Input S would have a restricted set of values 0, 1, and 3, Variable A would have a restricted set of values 0, 1 and 3, and Variable B would have a restricted set of values 0, 1 and 2. Once each restricted set of values is defined for a set of system model variables and inputs, the original system model is thereby transformed into a restricted model.

It should be noted that the restricted set of values for any system model variable and/or input does not necessarily have to include every value that the variable and/or input assumed during the partial search. For instance, where a system model variable assumes the value "1" in response to ten thousand different sets of inputs, and then assumes a value of "23" for only one set of inputs, that restricted set of values for that variable may be the value "1." As a result, the variable would be restricted to a constant value. Thus, the present invention is only limited by the step that the restriction be based on the values assumed by the system model inputs and variables during the partial search, not specifically to each value assumed.

Referring now to FIG. 3 there is shown a block diagram of an illustrative embodiment of a method 30 for forming a restricted model from a system model, according to the present invention. As shown, method 30 begins with the step 31 wherein particular system model variables and system model inputs, specifically those that have no effect on the system model functions or properties being tested, are removed from the system model to form a reduced system model. The reduced system model is then run through a partial search, at step 32. During the partial search, the values assumed by the inputs and variables of the reduced system model are identified, at step 33. Then, at step 34, the variables and inputs of the reduced system model are restricted to a range of values, based on the values assumed during the partial search, to form a restricted/reduced model. In addition, the variables and inputs of the restricted/reduced model that did not change value during the partial search are set as constants, and the reduction of step 31 is repeated, at step 35. The resultant restricted/reduced model can then be fully searched by conventional verification tools to identify errors. Advantageously, a full search of the restricted/reduced model requires less computational resources than a full search of the original system model. Thus, the present invention can enable a conventional verification tool to check the behavior of very complex system models without running out of computational resources.

It should be noted that the step of restricting the system model variables, as described above, may result in some system model variables being restricted to a constant value, whereas other system model variables may be restricted only to a limited range of values (i.e. a non-constant variable). When this happens, there often arises the situation wherein a constant variable depends on non-constant variable. This essentially has the effect of breaking the dependency between the constant variable and any variable upon which the value of the constant variable depends. This is due to the fact that the constant variable no longer will change value depending on the value of the variable upon which it depends.

When a restricted model having such broken dependencies is fully searched, there may be a set of inputs which cause the constant system model variable to remain at a value which it would not have assumed if the same set of inputs were input to the original (i.e. non-restricted) system model. As a result, the restricted system model may mistakenly enter a state or set of states that the original system model would not have entered given the same set of inputs. Moreover, due to the restricted model entering the mistaken state or set of states, a full search of the restricted model may report an error that does exist in the original model. Such and error is said to be a "false" error because it is not due to an error in the original model, rather it is a result of an imperfect restriction of the original model.

Thus, in order to obtain fall assurance that an error identified during a full search of a restricted system model, according to the present invention, is a true error, additional steps must be taken. In one embodiment, the additional steps may include the step of verifying that the identified error exists in the original system model (i.e. a false error check). The false error check may be accomplished by simply inputting into the original system model the same set of values that cause the error in the restricted model. If the original model reports the same error as identified during the full search of the restricted model, then the identified error is a true error. If, however, the original system model does not report the same error, then the error is a false error. In either case the identified error is verified. In the case of a false error, the restriction may be relaxed based on information obtained during the false error check, and the process is repeated (i.e. the relaxed restricted model is fully searched and the identified errors are verified as described above). More specifically, the restricted set of values for variables and inputs of the restricted model are resized, based on the values assumed by those variables and inputs during the error check. For example, if a restricted set of values for a given variable does not include a value that variable assumed during the error check, then the restricted set of values is changed to include that value. Thus, the restricted model is changed to more closely reflect the behavior of the original system model.

In another embodiment, the additional steps may include the step of adjusting the restricted model, before the full search, to guarantee that the restricted model will behave as would the original system model, when given the same set of inputs. One method of accomplishing this is, before performing a fall search of the restricted model, identifying all system model variables that are restricted, and that have a dependency on another system model variable that is not restricted. Then, testing the behavior of these identified variables during the fall search of the restricted model to determine whether the identified variables should assume a different value (i.e. a value other than the values to which it is restricted) when the variables upon which they depend (i.e. dependent variables) assume values according to their assumable range of values defined in the original system model. If during the full search of the restricted model the identified restricted variables assume a value not included in its restricted set, the state transitions of the restricted model, which are dependent on the identified variable assuming a value other than in the restricted set, are removed. This guarantees that the full search of the restricted model will not report false errors due to the broken dependencies discussed above.

In one embodiment, the step for checking whether an error identified during a full search of the restricted system model is a false error may include the steps of making a list of all system model variables that are dependent on a restricted system model variable and that lie in a dependency path from a variable in the reduced model, and include these variables in the reduced model, although their dependency path may be broken. This insures than any value of a variable in the reduced model which could propagate to an illegal value, could be detected as above.

In another illustrative embodiment, errors identified in the restricted model are verified by performing a full search of a reduced version of the original system model, resizing the variables of the restricted model, based on the values assumed by the variables during the full search of the reduced model, and then performing a second full search of the restricted model. In such an embodiment, the reduced version of the system model is formed by eliminating any portion of the system model that has no effect on the functions or features in which the error was identified. As a result, the full search is directed to checking only that specific portion of the system model related to the identified error.

If the fall search of the reduced system model reports the same error as found when fully searching the restricted model, then the error is a true error. If, however, the full search of the reduced system model does not report the same error, then the variables of the restricted model are resized, based on the values that each variable assumed during the full search of the reduced model, thus forming a new restricted model. Since the resizing essentially changes the restrictions of the system model variables to better reflect the behavior of the system model, the new restricted model is less likely to identify false errors than the original restricted model in any subsequent full search. As a result, by repeating this process for each identified error, the restricted model will become less and less likely to identify false errors, thus improving the process of fully searching a system model that was restricted according to the present invention.

It should be noted that a partial search used to make the restrictions, according to the present invention, can be a random partial search. A random partial search is a partial search of the system model state space wherein the values of the system model inputs are randomly chosen, rather than pre-set or predetermined. In such an embodiment, the verification tool can be empowered to randomly choose the values of the system model inputs during the partial search. This eliminates the need for a programmer, experienced in the details of the model, to make decisions as to which values should be tested for each system model input.

Figure 4:
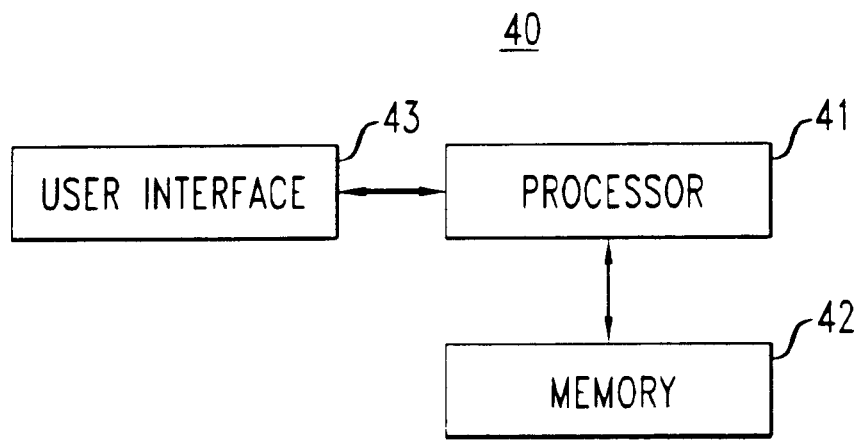
FIG. 4 is a block diagram of an illustrative embodiment of an apparatus according to the present invention.

The steps of the inventive method described above and shown in FIG. 3 can be performed by any desired means. Thus, an apparatus implementing the inventive method, herein, can have any desired structure that provides the desired functionality. An illustrative embodiment of an apparatus for reducing the amount of computational work associated with verifying the behavior of a system model, according to the present invention, is shown in FIG. 4, hereinafter referred to as apparatus 40. As shown, apparatus 40 has a processor 41 electrically coupled to a memory 42 and a user interface 43.

In operation, processor 41 is operable to reduce the system model state space to eliminate the set of system model variables and system model inputs that have no effect on the behavior of a given set of properties of the system model, that are intended to be tested. The reduction thereby transforms the system model into a reduced model. Processor 41 is also operable to run a partial search of the reduced model, identify the values assumed by each variable and each input of the reduced model during the partial search, and store the identified values in memory 42. Processor 41 is further operable to restrict or re-size the range of assumable values for each variable and each input of the reduced model, based on the values stored in memory 42, to form a restricted/reduced model. The restricted/reduced model can then be fully-checked by a conventional verification tool (not shown), and processor 41 can report any detected errors to a user through user interface 43.

Figure 5:
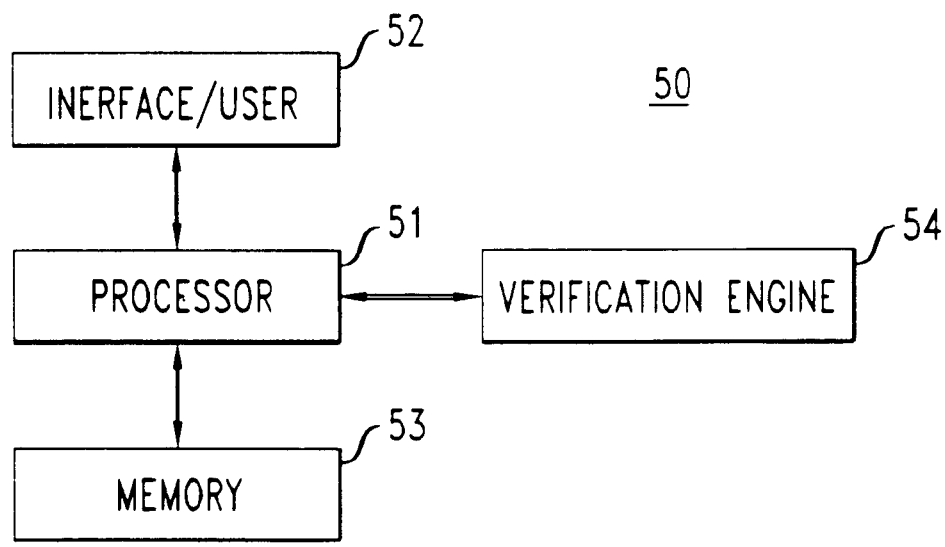
FIG. 5 is a block diagram of an illustrative embodiment of a system for detecting errors in models that were restricted according to the present invention.

Referring now to FIG. 5, there is shown a block diagram of an illustrative a embodiment of a system for restricting a system model according to the present invention, and identifying errors in the restricted model, hereinafter referred to as system 50. As shown, system 50 has a processor 51 electrically coupled to a memory 53, an interface 52 and a verification engine 54. In operation, processor 51 is operable to direct verification engine 54 to run a partial search of a system model. During the partial search, processor 51 identifies the values assumed by each system variable and each system input, and stores the values in memory 53. Processor 51 is further operable to restrict the system variables and system inputs to a set of values, based on the values stored in memory 53, to form a restricted model. Processor 51 is yet further operable to input the restricted model into verification engine 54 which, in turn, runs a full search of the restricted model. The results of the fall search are then reported by Processor 51 to a user through interface 52.

Advantageously, if an error is identified during the partial-search, there is full assurance that an error exists in the original model. If, however, no error is found in either the partial search or the full search, then there is only partial assurance that the original model is error-free. As described above, the partial assurance is due to the fact that only a partial search is performed on the original model, or alternatively, due to the fact that a full search is only performed on a reduced version of the original model.

If an error is identified during a full search of the restricted model, there is only partial assurance that the error exists. The partial assurance is due to the fact that a restriction according to the present invention may cause a non-constant variable to be dependent on a variable restricted to a constant value. As described above, the system model can be utilize any means desirable by those skilled in the art to verify or check whether the identified error in the restricted model is a "true error in the original system model. Thus, although the present invention can not fully insure, in all cases, that the original model is error-free, the present invention provides a means for reliably finding errors in complex models which previously could not be reliably tested through conventional verification tools, without tedious manual restrictions of the design model.

While the invention has been particularly shown and described with reference to various embodiments, it will be recognized by those skilled in the art that modifications and changes may be made to the present invention without departing from the spirit and scope thereof accordingly, various modifications may be made without departing from the spirit or scope of the general inventive concept as defined by the appended claims and their equivalents.

We claim:

1. A method for identifying errors in a system model, the system model defining a state space including a plurality of states and state transitions, the state transitions being dependent on values assumed by system model variables and system model inputs, each system model variable and each system model input having a range of assumable values, the method comprising the steps of:

forming a restricted model from the system model comprising the step of restricting the range of assumable values of a set of system model variables and a set of system model inputs based on the values assumed by the system model variables and the system model inputs during a partial search of the system model, to thereby form a restricted model, the step of restricting defining for each variable of said set of system model variables and each input of said set of system model inputs, a restricted set of values which it can assume during a verification of said restricted model;

and automatically running a full search of said restricted model to identify errors in the system model.

2. The method of claim 1 further comprising the steps of:

before said step of automatically running a full search, analyzing said restricted model to identify variables, restricted to a constant value during said step of restricting, that have a broken dependency with at least one other restricted-model variable; and eliminating, from said restricted model, each said identified variable that should assume a value other than its said constant value, as a result of its dependency on one of said other restricted model variables, when said other restricted-model variables assume a value in said restricted set of values defined therefor.

3. The method of claim 2 further comprising the step of removing, from said restricted model, a set of restricted model variables having a dependency on said variables eliminated from said restricted model as a result of said step of eliminating.

4. The method of claim 1 further comprising the step of verifying whether said identified errors, during said full search, are true errors.

5. The method of claim 4 wherein said step of verifying comprises the step of inputting, into said system model, the set of input values that caused the identified error in the restricted model, and determining whether said system model exhibits an error identical to said error identified in said restricted model.

6. The method of claim 1 further comprising the steps of:

identifying restricted model variables that are dependent on a variable having a restricted set of values; and determining whether any identified variables assumed a value that would have been impossible for that variable to assume in the system model.

7. The method of claim 1 further comprising the step of resizing a set of restricted model variables, based on a partial search of a reduced system model.

8. The method of claim 7 wherein said reduced system model is formed by eliminating portions of the system model that have no effect on the system model functions in which an error is identified, and wherein said set of restricted model variables are resized when said full search of said reduced system model fails to report the same error identified during said full search of said restricted model.

9. The method of claim 8 wherein said step of automatically performing a full search comprises the step of identifying errors in the system model.

10. The method of claim 9 further comprising the steps of:

before said step of automatically performing a full search, analyzing said restricted/reduced model to identify variables, restricted to a constant value during said step of restricting, that have a broken dependency with at least one other restricted/reduced-model variable; and eliminating, from said restricted/reduced model, each said identified variable that should assume a value other than its said constant value, as a result of its dependency on one of said other restricted/reduced model variables, when said other restricted/reduced-model variables assume a value in said restricted set of values defined therefor.

11. The method of claim 10 further comprising the step of removing, from said restricted/reduced model, a set of restricted model variables having a dependency on said variables eliminated from said restricted/reduced model as a result of said step of eliminating.

12. The method of claim 9 further comprising the step of verifying whether said identified errors, during said full search, are true errors.

13. The method of claim 12 wherein said step of verifying comprises the step of inputting, into said system model, the set of input values that caused the identified error in the restricted/reduced model, and determining whether said system model exhibits an error identical to said error identified in said restricted/reduced model.

14. The method of claim 9 further comprising the steps of:

identifying restricted model variables that are dependent on a variable having a restricted set of values; and determining whether any identified variables assumed a value that would have been impossible for that variable to assume in the system model.

15. The method of claim 9 further comprising the step of resizing a set of restricted model variables, based on a full search of a reduced system model.

16. The method of claim 15 wherein said reduced system model is formed by eliminating portions of the system model that have no effect on the system model functions in which an error is identified, and wherein said set of restricted model variables are resized when said full search of said reduced system model fails to report the same error identified during said full search of said restricted/reduced model.

17. The method of claim 9 herein said partial search is a random partial search, and wherein said step of restricting is performed automatically.

18. The method of claim 1 wherein said partial search is a random partial search, and wherein said step of restricting is performed automatically.

19. The method of claim 18 further comprising the step of eliminating, from the system model, a set of system model variables and system model inputs that have no effect on the behavior of the system model when checking a set of system model properties so that said step of restricting forms a restricted/reduced model.

20. A method for identifying errors in a system model, the system model being designed to behave in accordance with a set of properties, wherein the system model behavior is dependent on the values assumed by system model variables and system model inputs, each system model variable and each system model input being able to assume a value within a given range of values, the method comprising the steps of:

eliminating, from the system model, a set of system model variables and system model inputs that have no effect on the behavior of a given set of properties of the system model so that the system model is formed into a reduced model;

restricting the range of assumable values of a set of variables and inputs of the reduced model to a restricted set of values, based on the values assumed by the variables and inputs during a partial search of the reduced model, to form a restricted/reduced model; and automatically performing a full search of the restricted/reduced model to check the behavior of said given set of properties.

21. An apparatus for verifying the behavior of a system model, the system model having a set of states and a set of state transitions, each state transition being dependent on the value of system model variables and system model inputs, each system model variable and each system model input having a range of assumable values, the apparatus comprising:

means for restricting the range of assumable values of a set of system model variables and a set of system model inputs, said restriction being based on the values assumed by system model variables and system model inputs during a partial search of the system model to form a restricted model; and means for automatically performing a full search of the restricted model to check the behavior of a given set of properties.

22. The apparatus of claim 21 further comprising means for automatically running a full search of the restricted model to identify errors in the system model.

23. A system for identifying errors in a system model, the system model having properties which function according to the values assumed by system model variables and system model inputs, each system model variable and each system model input being able to assume a value within a given range of values, the system comprising:

means for eliminating, from the system model, a set of system model variables and a set of system model inputs that have no effect on the behavior of a given set of properties of the system model to form a reduced model;

means for running a partial search of the reduced model, and identifying a range of values assumed during said partial search for a set of system model variable and a set of system model inputs of the reduced model;

means for limiting the range of assumable values for a set of system model variables and a set of system model inputs of the reduced model to said range identified during said partial search, to form a restricted/reduced model; and means for automatically performing a full search of the restricted/reduced model to check the behavior of said given set of properties.

24. The system of claim 23 further comprising means for verifying whether said errors identified in the restricted/reduced model are true errors in the system model.

25. An apparatus for verifying the behavior of a system model, the system model defining a state space including a finite number of states and state transitions, the state transitions being dependent on values assumed by system model variables and system model inputs, wherein each system model variable and each system model input has a range of assumable values, the apparatus comprising:

means for forming a restricted model from a system model comprising means for obtaining values assumed by the system model variables and the system model inputs during a partial search of the system model, and means for restricting the range of assumable values of a set of the system model variables and a set of the system model inputs, based on said values assumed during said partial search, to form a restricted model, said means for restricting defining, for each variable of said set of system model variables, and each input of said set of system model inputs, a restricted set of variables which it can assume during a verification of said restricted model; and means for automatically running a full search of said restricted model to identify errors in the system model.

26. The apparatus of claim 25 further comprising:

means for analyzing said restricted model to identify variables, restricted to a constant value by said means for restricting, that have a broken dependency with at least one other restricted-model variable; and means for eliminating, from said restricted model, each said identified variable that should assume a value other than its said constant value, as a result of its dependency on one of said other restricted model variables, when said other restricted-model variables assume a value in said restricted set of values defined therefor.

27. The apparatus of claim 26 further comprising means for removing, from said restricted model, a set of restricted model variables having a dependency on said variables eliminated from said restricted model.

28. The apparatus of claim 25 further comprising means for verifying whether said identified errors, during said full search, are true errors.

29. The apparatus of claim 28 wherein said means for verifying comprises means for inputting, into said system model, the set of input values that caused the identified error in the restricted model, and determining whether said system model exhibits an error identical to said error identified in said restricted model.

30. The apparatus of claim 25 further comprising:

means for identifying restricted model variables that are dependent on a variable having a restricted set of values; and means for determining whether any identified variables assumed a value that would have been impossible for that variable to assume in the system model.

31. The apparatus of claim 25 further comprising means for resizing a set of restricted model variables, based on a full search of a reduced system model.

32. The apparatus of claim 31 wherein said reduced system model is formed by eliminating portions of the system model that have no effect on the system model functions in which an error is identified, and wherein said set of restricted model variables are resized when said full search of said reduced system model fails to report the same error identified during said full search of said restricted model.

33. The apparatus of claim 25 wherein said partial search is a random partial search, and wherein said means for restricting is performed automatically.

34. The apparatus of claim 25 further comprising means for eliminating, from the system model, a set of system model variables and system model inputs that have no effect on the behavior of the system model when checking a set of system model properties so that said means for restricting forms a restricted/reduced model.

* * * * *